United States Patent
Li et al.

(10) Patent No.: US 6,555,503 B1
(45) Date of Patent: Apr. 29, 2003

(54) SIMULTANEOUS CONSTRAINT AND PHASE CONVERSION PROCESSING OF OXIDE SUPERCONDUCTORS

(75) Inventors: Qi Li, Marlborough, MA (US); Elliott D. Thompson, Coventry, RI (US); Gilbert N. Riley, Jr., Marlborough, MA (US); Eric E. Hellstrom, Madison, WI (US); David C. Larbalestier, Madison, WI (US); Kenneth L. DeMoranville, Jefferson, MA (US); Jeffrey A. Parrell, Roselle Park, NJ (US); Jodi L. Reeves, Madison, WI (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/665,882

(22) Filed: Sep. 20, 2000

Related U.S. Application Data (60) Provisional application No. 60/155,009, filed on Sep. 21, 1999.

(51) Int. Cl.$^7$ .......................... H01B 12/00; H01L 39/12; C04B 35/645
(52) U.S. Cl. ...................... 505/432; 505/433; 505/501; 505/822
(58) Field of Search ................................ 505/230, 231, 505/432, 433, 501, 739, 740, 785, 822

(56) References Cited

U.S. PATENT DOCUMENTS

| | | | |
|---|---|---|---|
| 4,988,669 A | 1/1991 | Dersch | 505/1 |
| 5,004,722 A | 4/1991 | Tallman | 505/1 |
| 5,145,835 A | 9/1992 | Tekeshita et al. | 505/1 |
| 5,204,316 A | 4/1993 | Arendt et al. | 505/1 |
| 5,382,405 A | 1/1995 | Lowrance, II et al. | 505/125 |
| 5,472,527 A | 12/1995 | Otto et al. | 505/431 |
| 5,994,275 A | 11/1999 | Otto et al. | 505/121 |
| 6,069,116 A | 5/2000 | Li et al. | 505/431 |

FOREIGN PATENT DOCUMENTS

| | | |
|---|---|---|
| EP | WP 0 503 525 | 3/1992 |
| JP | 2-196054 | 8/1990 |
| WO | WO 92/13649 | 8/1992 |
| WO | WO 94/00886 | 1/1994 |
| WO | WO 96/14655 | 5/1996 |
| WO | WO 96/28853 | 9/1996 |

OTHER PUBLICATIONS

Neurgaonkar et al "Densifiaction of Grain Oriented High Tc Superconductors . . . ", Mat. Res. Bull., vol. 24, pp 1541–1547. 1989.*

Tien et al "Hot Isostatic Pressing (HIP) For The Densfication of Oxide Superconductors", MRS: High Temp. Super. II, Apr. 1988, pp. 73–76.*

(List continued on next page.)

*Primary Examiner*—Mark Kopec
(74) *Attorney, Agent, or Firm*—Hale and Dorr LLP (57) ABSTRACT

A method of making an oxide superconductor article includes subjecting an oxide superconductor precursor to a texturing operation to orient grains of the oxide superconductor precursor to obtain a highly textured precursor; and converting the textured oxide superconducting precursor into an oxide superconductor, while simultaneously applying a force to the precursor which at least matches the expansion force experienced by the precursor during phase conversion to the oxide superconductor. The density and the degree of texture of the oxide superconductor precursor are retained during phase conversion. The constraining force may be applied isostatically.

32 Claims, 6 Drawing Sheets

OTHER PUBLICATIONS

Allemeh et al., "Effect of High–Temperature, High–Oxygen–Fugacity Annealing on the Stability of the (Bi, Pb)$_2$Sr$_2$Ca$_2$Cu$_3$O$_{10\pm\delta}$–type Compound" Presented at the 96$^{th}$ Annual Meeting of the American Ceramic Society, Indianapolis, IN (Apr. 27, 1994) Electronics Division, Paper No. E–59–94.

Balanethiram and Daehn, "Hyperplasticity: Increased Forming Limits at High Workpiece Velocity" *Scripta Metallurgica et Materialia* 30:515–520 (1994).

Bourdillon et al., "Hot Isostatically Pressed Bi$_2$Sr$_2$Ca$_2$Cu$_3$O$_{10}$ Coils Made with Novel Precursors" *Journal of Materials Science Letters* 15:439–441 (1996).

Chmielewski and Sandhage, "The Stability of Bi$_2$Sr$_2$Ca$_1$Cu$_3$O$_{8\pm\delta}$ Thick Films at Elevated Oxygen Pressures and Temperatures" *Journal of the American Ceramic Society* 78:2504–2512 (1995).

Dou and Liu, "Ag–sheathed Bi(Pb)SrCaCuO Superconducting Tapes" *Supercond. Sci. Technol.* 6:297–314 (1993).

Dou et al., "Improvement of Critical Current Density in the Bi–Pb–Sr–Ca–Cu–O System Through Hot Isostatic Pressing" *Physica C* 167:525–528 (1990).

James et al., "Computer–Modelled Deformation Mechanism Maps for Hot Uniaxially Pressed Bi–2223 Superconductor" *Journal of Materials Science* 32:1409–1414 (Mar. 1997).

Hu et al., "Bulk YBa$_2$Cu$_3$O$_x$ Superconductors Through Pressurized Partial Melt Growth Processing" *J. Mater. Res.* 7:808–812 (1992).

Ishizaki, "Phase Diagrams Under High Total Gas Pressures–Ellingham Diagrams for Hot Isostatic Press Processes" *Acta Metall. Mater.* 38:2059–2066 (1990).

Liu et al., "Effect of Hot Pressing on the Weak–Link Behaviour of Ag Clad Bi Based Superconducting Tapes" *Physica C* 259:187–192 (1996).

Miyatake et al., "Preparation and Superconducting Properties of YBa$_2$Cu$_4$O$_8$" *Physica C* 160:541–544 (1989).

Murayama et al., "Mechanical Strength of Hot–Pressed Bi–Pb–Sr–Ca–Cu–O Superconductor" *J. Mater. Res.* 7:34–37 (1992).

Neurgaonkar et al., "Densification of Grain–Oriented High T$_c$ Superconducting Ba$_2$Ln$^{3+}$Cu$_3$O$_{7-x}$ and Bi$_2$Ca$_2$Sr$_2$Cu$_2$O$_8$ Ceramics" *Mat. Res. Bull.* 24:1541–1547 (1989).

Nhien et al., "Bulk Texturing of Prereacted Bi/Pb(2223) Under Triaxial Stresses at Room Temperature" *Physica C* 235–240:3403–3404 (1994).

Pachla et al., "Thick Textured Films of Bi–type Ceramics by Hot Pressing" *Applied Superconductivity* 1:745–754 (1993).

Reeves et al., "Overpressure Processing of Ag–Sheathed Bi–2212 Tapes" *EEE Transactions of Applied Superconductivity* 7:1541–1543 (1997).

Seino et al., "HIPped High Density Bi–(Pb)–Sr–Ca–Cu–O Superconductors Produced without Any Additional Treatment" *Japanese Journal of Applied Physics* 28:78–81 (1989).

Tien et al., "Densification of Oxide Superconductors by Hot Isostatic Pressing" *Metallurgical Transactions A* 19A:1841–1847 (1988).

Tien et al., "Hot Isostatic Pressing (HIP) for the Densification of Oxide Superconductors" Center for Strategic Materials, Columbia University, p73–76.

Yoo and Mukherjee, "Effect of Mechanical Deformation and Annealing on the Evolution of c–axis Texture of Bi$_{1.6}$Pb$_{0.4}$Sr$_2$Ca$_2$Cu$_3$O$_z$ Superconductor Hot–Isostatic–Press Cladded onto a Ag Substrate" *Journal of Materials Science* 29:4306–4314 (1994).

Yoo and Mukherjee, "The Stability of High–T$_c$ Phase in Bi$_{1.6}$Pb$_{0.4}$Sr$_2$Ca$_2$Cu$_3$O$_z$ Compounds Prepared by Hot Isostatic Pressing" *Journal of Materials Science* 28:2361–2365 (1993).

Zeng et al., "Significantly Enhanced Critical Current Density In Bi–2223/Ag Multifilamentary Tapes by Hot Pressing" *IEEE Transactions on Applied Superconductivity* 9:2742–2745 (Jun. 1999).

International Search Report from PCT/US00/25749 (Jan. 17, 2001).

\* cited by examiner

SIMULTANEOUS CONSTRAINT AND PHASE CONVERSION PROCESSING OF OXIDE SUPERCONDUCTORS

This application claims priority under 35 U.S.C. § 119(e) to co-pending application Ser. No. 60/155,009 filed Sep. 21, 1999.

This invention was made with the support of the United States government under Department of Energy Grant No. DE-FG02-99ER82742. The United States may have certain rights in the invention.

BACKGROUND OF THE INVENTION

This invention relates to processing of oxide superconductor composites to obtain high density, textured oxide superconductor articles.

Polycrystalline, randomly oriented oxide superconductor materials are generally characterized by their low density and low critical current densities. High oxide density, good oxide grain alignment and grain interconnectivity, however, are associated with superior superconducting properties.

Composites of superconducting materials and metals are often used to obtain better mechanical properties than superconducting materials alone provide. These composites may be prepared in elongated forms such as wires and tapes by the well-known "powder-in-tube" or "PIT" method. When powders include metal oxides or other oxidized metal salts, the method is referred to as "oxide-powder-in-tube" or OPIT. For multifilamentary articles, the method generally includes the three stages of (a) forming a powder of superconducting precursor materials (precursor powder formation stage), (b) filling a noble metal billet with the precursor powder, longitudinally deforming and annealing it, forming a bundle of billets or of previously formed bundles, and longitudinally deforming and annealing the bundle to provide a composite of reduced cross-section including one or more filaments of superconductor precursor material surrounded by a noble metal matrix (composite forming stage); and (c) subjecting the composite to successive asymmetric deformation and annealing cycles and further thermally processing the composite to form and sinter a core material having the desired superconducting properties (thermomechanical processing stage). General information about the OPIT method described above and processing of the oxide superconductors is provided by Sandhage et al. in *JOM*, Vol. 43, No. 3 (1991), pp 21–25, and references cited therein; by Tenbrink et al., "Development of Technical High-Tc Superconductor Wires and Tapes", Paper MF-1, Applied Superconductivity Conference, Chicago (Aug. 23–28, 1992); and by Motowidlo et al., "Properties of BSCCO Multifilament Tape Conductors", Materials Research Society Meeting, Apr. 12–15, 1993, all of which are incorporated by reference.

The deformations of the thermomechanical processing state are asymmetric deformations, such as rolling and pressing, which create alignment of precursor grains in the core ("textured" grains) and facilitate the growth of well-aligned and sintered grains of the desired oxide superconducting material during the later thermal processing stages. A series of heat treatments is typically performed during the thermomechanical processing stage to promote powder reactions, including the final thermomechanical processing stages employed to fully convert the filaments to the desired highly textured superconducting phase.

In the practice of the above prior art approach, it has been found that when heating during the thermomechanical processing stage, the oxide grains experience dilation leading to reduced oxide core density and increased porosity of the oxide core. Dilation is the loss of core material density due to introduction of pore space and/or changes in grain size and structure. Dilation is thought to be caused by gas evolution and by the growth of non-aligned oxide grains during heating.

Achieving high density in ceramics and ceramic composites is not a new problem. For other ceramic systems, such as $Al_2O_3$ for structural problems, high density is achieved by heating the final product under high pressure.

Current approaches to rectifying the de-densification arising from the annealing process include mechanical deformation to redensify the oxide material. For example, Dou et al., in "Improvements of Critical Current Density in the Bi—Pb—Sr—Ca—Cu—O System Through Hot Isostatic Pressing" (*Physica* C, 167:525 (1990)), report similar results by hot isostatically pressing (HIPing) BSCCO pellets and powders. Bourdillon et al., in "Hot Isostatically Pressed Bi2Sr2Ca2Cu3O10 Coils Made with Novel Precursors," describe HIPing of a BSCCO 2223 coil. Nhien et al., in "Bulk Texturing of Prereacted Bi/Pb(2223) under Triaxial Stresses at Room Temperature" (*Physica* C 235–240:3404 (1994)), use isostatic confinement coupled with an overload in one direction to promote grain alignment of a fully formed (Bi,Pb)SCCO 2223 material. International Application Publication No. WO 94/00886, entitled "High Tc Superconductor and Method of Making" and published Jan. 6, 1994, also describes an isostatic pressing operation after a heat treatment to impart superconducting properties to the precursor and before a final heat treatment to complete the phase conversion.

These approaches represent attempts to modify the oxide grain structure after de-densification of the oxide core has occurred. Such deformation steps are carried out when phase conversion to the final desired oxide superconductor is complete or nearly complete. While deformation processing may result in increased core density, at this late stage in the process it introduces both intergranular and intragranular cracks in the oxide phase that are highly resistant to healing by conventional annealing processes.

Other examples in the prior art use HIPing to introduce texture into the oxide superconductor composite, in particular, in those instances where asymmetric deformation is not preferred. EP 0 503 525 discloses the preparation of a twisted, multifilamentary oxide superconductor composite. The method relies upon drawing to alter the cross-sectional size and shape of the filaments during assembly of the multifilamentary composite, a method that is known to be ineffective in producing a high density, highly textured oxide phase, i.e., such methods result in f<0.7 (as defined herein) and density within the filaments is less than 60% theoretical. In order to texture to a degree approaching acceptable levels, the composite is HIPed. Thus, HIPing is used to introduce density or texture into the composite and not to retain any previously introduced texture of the composite during subsequent processing steps. EP 0 503 525 does not address the problem of dilation, since the oxide phase was not significantly densified and textured in the first place.

Furthermore, not all deformation processes have the desired effect of texturing and/or densifying the oxide material. See Pachla et al., in "Thick textured films of Bi-type ceramics by hot pressing" (*Applied Superconductivity*, 1(1–3):745 (1993)), who report hot pressing of BSCCO 2212 phase. The process resulted in a significant crushing of the oxide superconductor phase, and did not show evidence of texturing or densification of the BSCCO 2212 phase.

Still other groups have used HIPing to densify powder compacts of the oxide superconductor. Tien et al., in "Densification of Oxide Superconductors by Hot Isostatic Pressing" (*Metallur. Trans. A*, 19A:1841 (July 1988)), report an increase in density of a $YBa_2Cu_3O_x$ powder compact from 65% theoretical density to 99% of theoretical. HIPing was performed on a fully formed oxide superconductor.

Thus, there remains a need to overcome the problem of dilation, i.e., de-densification, of the oxide core material in multifilamentary composites during heat treatments, without the drawback of introducing cracks or other defects in the process. What is needed is a process that prevents or substantially prevents dilation from occurring in the first instance. Such a process would clearly present great advantages over the prior art processes in that no remedial action is required.

SUMMARY OF THE INVENTION

The present invention overcomes the limitations of the prior art by converting a highly textured oxide superconducting precursor into an oxide superconductor, while simultaneously applying a force to the oxide superconductor precursor which at least matches the expansion force experienced by the precursor during phase conversion to the oxide superconductor, whereby the density and the degree of texture of the oxide superconductor precursor are retained or substantially retained during phase conversion.

In one aspect of the invention, a method of making an oxide superconductor article includes converting a textured oxide superconducting precursor into a selected oxide superconductor, while simultaneously applying a force to the precursor which at least matches the expansion force experienced by the precursor during phase conversion to the selected oxide superconductor, whereby the near net shape of the oxide superconductor precursor is substantially retained during phase conversion.

By "highly textured" as that term is used herein, it is meant that the oxide grains have been oriented and aligned to a significant degree. Most commonly, the extent of texture development in an oxide material is quantified using an f-factor. A lotgering factor, or f-factor, of a material is obtained from the X-ray diffraction (XRD) pattern of the material by relating the peaks associated with the oriented grains to those of all peaks. In the case of c-axis aligned BSCCO-2212, the 001 intensities are an indication of texture. When the oxide is fully aligned, no other peaks are observed in the XRD pattern and the ratio, i.e., f-factor, is 1.0. When the oxide is fully random, the f-factor is zero. In preferred embodiments, the f-factor has a value of at least 0.7, more preferably at least 0.8 and most preferably at least 0.9. In the preferred processing methods described herein to obtain a highly textured oxide, f-factors on the order of 0.95 are attainable.

By "highly dense" as that term is used herein, it is meant a density that is at least 70% dense relative to theoretical. Preferably, highly dense oxides possess a density that is greater than 80%, and most preferably greater than 90% dense, relative to theoretical (in which the material has no pore space or voids).

By "near net shape" as that term is used herein, it is meant the external physical dimensions of the filamentary article. Because the length of the article is not greatly affected by the processing described herein, the near net shape is defined by the cross-sectional shape of the article as measured by the external perimeter of the article cross-section. The parameter correlates closely to dilation of the article, in that, greater dilation during processing results in greater change in near net shape. Changes in near net shape are determined with reference to the cross-sectional shape of the article as measured by the external perimeter of the article cross-section before and after phase converting heat treatments. In preferred embodiments, articles of the invention demonstrate overall changes in near net shape of less than 1% as a result of phase conversion, i.e., the external physical dimensions of the article remain substantially unchanged. Minor changes in near net shape are highly advantageous as it allows one to set the dimensions of the final product early on in the process in forming the precursor.

By "oxide superconductor precursor," is meant any material that can be converted into the selected and final oxide superconductor under appropriate conditions, e.g., a suitable heat treatment. Suitable precursor materials include, but are not limited to, metal salts, simple metal oxides, complex mixed metal oxides, and even an intermediate oxide superconductor. An intermediate oxide superconductor is an oxide superconductor, which is capable of being converted into a selected oxide superconductor. It often is used as a mixed phase material in combination with other components, typically non-superconductive, which in combination can be reacted to form the final oxide superconductor. An intermediate oxide superconductor may have desirable processing properties, which warrants its formation initially before final conversion. For example, an intermediate oxide superconductor may be more amenable to texturing than the final oxide superconductor.

The phase conversion may involve a change in composition or a change in crystallographic phase.

In most instances, the precursor material and final oxide superconductor differ in composition. That is, the compounds defining the precursor are different than those of the selected oxide superconductor. For example, in the preparation of BSCCO 2223, the precursor typically includes an intermediate BSCCO 2212 oxide superconductor and secondary metal oxides.

In other instances, the precursor material and the final oxide superconductor may have the same composition, but may differ in crystallographic phase. By crystallographic phase is meant that the lattice symmetry differs such that the crystallographic characterization of the material differs. Examples of materials that differ crystallographically are different symmetry phases of materials having the same or similar composition, such as the tetrahedral and orthogonal phases of BSCCO 2212.

In some embodiments, the oxide superconductor precursor is subjected to a texturing operation to orient grains of the oxide superconductor precursor to obtain the highly textured precursor. According to the invention, the article is textured prior to phase conversion, and the phase-converting heat treatment is not relied upon to also texture the article.

In other embodiments, the oxide superconductor precursor and the selected oxide superconductor differ in composition, or in another embodiment, they differ crystallographically.

In other embodiments, the density of the oxide superconductor precursor is substantially retained during phase conversion. In alternative embodiments, the texture of the oxide superconductor precursor is substantially retained during phase conversion.

In some embodiments, the near net shape changes less than 7%, preferably less than 6%, preferably less than 3%, and more preferably less than 1.5% between the precursor and the final article.

In other embodiments, substantially retained includes a change of less than 20%, preferably less than 10%, and more preferably less then 5% in density between the precursor and the final article.

In still other embodiments, substantially retained includes a change of less than 10%, preferably less than 5%, and more preferably less than 2.5% in degree of texture between the precursor and the final article.

In some embodiments, the force applied to the precursor comprises hot isostatic pressing (HIPing), and the HIPing force is in the range of 10 to 2500 atm (1–250 MPa), and preferably in the range of 25 to 250 atm (2.5–25 MPa).

In other embodiments, dilation of the oxide superconductor article is less than 7%, and preferably less than 6% in the direction transverse to the direction of elongation, and more preferably is in the range of 1–6% in the direction transverse to the direction of elongation.

In other embodiments, the precursor oxide comprises BSCCO 2212, and the final oxide superconductor comprises BSCCO 2223, and preferably, the precursor oxide comprises BSCCO 2212, and the final oxide superconductor comprises BSCCO 2223, and wherein the temperature and oxygen partial pressure are selected to fall in a range in which BSCCO 2223 is thermodynamically stable.

In still other embodiments, the pressure is constant during phase conversion.

In still other embodiments, the highly textured precursor possesses a degree of texture greater than or equal to 0.7, and preferably greater than 0.8, and more preferably greater than 0.9.

In alternative embodiments, the precursor is textured using asymmetric deformation, and preferably the asymmetric deformation is selected from the group consisting of rolling and pressing. The rolling deformation results in a 40–95% reduction in thickness of the article.

In another embodiment, the precursor is textured using reaction-induced texturing, and preferably, the precursor comprises BSCCO 2212 and reaction induced texturing is conducted at a temperature in the range of 800–860° C. and an oxygen partial pressure in the range of 0.01–1.0 atm (1–100 ×10$^{-3}$ MPa).

In another embodiment, BSCCO 2212 is converted into BSCCO 2223 in a two-step heat treatment in which the precursor is heated under conditions which form a liquid phase in co-existence with BSCCO 2223 and then the precursor is heated under conditions which transform the liquid phase into BSCCO 2223.

In another aspect of the invention, an oxide superconductor composite includes one or more filaments of an oxide superconductor in a metal matrix, wherein the oxide superconductor composite demonstrates a near net shape change of less than 6% between a precursor to the oxide superconductor composite and the oxide superconductor composite.

In some embodiments, the oxide superconductor composite demonstrates a near net shape change after processing of less than 3% and preferably less than 1.5% between the precursor and the oxide superconductor composite.

In another aspect of the invention, a simplified process for making an oxide superconductor article of acceptable texture, density and current carrying properties is provided. The process includes providing a precursor composite comprising one or more filaments of BSCCO 2212 in a metal matrix, texturing the BSCCO 2212 precursor composite in a rolling deformation step, wherein the rolling deformation results in a 40–95% reduction in thickness of the composite, converting the textured BSCCO oxide superconducting precursor into a BSCCO 2223 oxide superconductor, while simultaneously applying a force to the precursor which at least matches the expansion force experienced by the precursor during phase conversion to the BSCCO 2223 oxide superconductor, whereby the near net shape of the oxide superconductor precursor is substantially retained during phase conversion and whereby no further densification or texturing of the composite occurs.

In another aspect of the invention, a BSCCO 2223 oxide superconductor composite includes one or more filaments of a BSCCO 2223 oxide superconductor in a metal matrix, wherein the oxide superconductor has a density of at least 90% theoretical density and an f-factor of at least 0.7, preferably at least 0.8, and more preferably at least 0.9. The composite is substantially free of cracks and defects as observed under an optical microscope.

An advantage of the method of the invention is the elimination of costly processing steps without detrimental effect on the superconducting properties of the article. Thus, the process may be reduced to a single deformation and heat treatment (a "1DS" process) because there is no need to carry out an intermediate deformation (and subsequent heat treatment) to redensify the material.

BRIEF DESCRIPTION OF THE DRAWINGS

The invention is described with reference to the following Figures, which are presented for the purpose of illustration only and which are not limiting of the invention, and in which.

DESCRIPTION OF THE PREFERRED EMBODIMENTS

The sources of dilation and hence, the understanding of the expansion forces working on the oxide composite, are complex. In most cases, the oxide precursor to the final oxide superconductor will be made up of a mixture of phases, in which the overall stoichiometry of the phases substantially corresponds to that of the final oxide superconductor. While the oxide precursor is desirably highly textured and dense, its grain size and morphology are different than those of the final oxide superconductor. Consumption of the precursor phases and growth of the final oxide superconductor can lead to void spaces within the composite (previously occupied by material consumed to make the oxide superconductor) and grain elongation (as the oxide precursor grains react with other secondary phases to form the final oxide superconductor). As they grow, the grains push apart neighboring grains in their path. The combination of void formation and grain elongation results in a significant expansion of the oxide phase with a concomitant reduction in density, texture and electrical transport.

The present invention is based on the discovery that it is preferable and possible to avoid substantial dilation of an oxide core of a multifilamentary material during heat treatments rather than take remedial steps to correct the dilation once it has occurred. This is accomplished by simultaneously applying a force to an oxide composition during phase conversion of the oxide to a final oxide superconductor. The force opposes the expansion force experienced by the composite during heat treatment or 2223 phase conversion to constrain the material and prevent dilation and de-densification.

The method of the invention may be used for the processing of both monofilament and multifilament composites. The oxide superconductor used in the preparation of the mono- or multifilamentary article preferably is a member of the bismuth-strontium-calcium-copper-oxide (BSCCO) family of superconductors, in particular, $Bi_2Sr_2Ca_1Cu_2O_8$ (BSCCO 2212) and $Bi_2Sr_2Ca_2Cu_3O_{10}$ (BSCCO 2223). Particularly promising results are obtained when the bismuth is partially substituted by dopants, such as lead, e.g., (Bi,Pb) SCCO. A most preferred oxide superconductor is $(Bi,Pb)_{2.1}Sr_2Ca_2Cu_3O_x$. For the purposes of the discussion which follows, use of the term BSCCO includes both the lead-doped and the lead-free composition unless specifically stated otherwise.

In a preferred embodiment, the final oxide superconductor is BSCCO 2223 and the oxide precursor is BSCCO 2212 and additional secondary phases, e.g., BSCCO 0011, necessary to provide the proper overall stoichiometry for BSCCO 2223. BSCCO 2212 plus secondary phases is a preferred precursor oxide because the grains of BSCCO 2212 are readily densified or textured using conventional processes. It is recognized however that other oxide precursors may be used in accordance with the method of the invention, so long as they are susceptible to texturing and can be converted into an oxide superconductor. Both the rare earth-barium cuprate (YBCO) and thallium-barium-calcium-cuprate (TBCCO) families of oxide superconductors include anisotropic oxide grains and so may be used in the present invention.

The method of the invention is described with reference to FIG. 1, which compares the steps of a conventional oxide superconductor wire process with that of the method of the invention. A mono- or multifilamentary oxide precursor may be made by any conventional method. For example, an oxide powder in tube (OPIT) method may be used according to the general description given by Sandhage et al. (supra) in which precursor compounds, such as oxides, salts or metallorganic compounds, are loaded into a metallic tube and sealed, and thereafter subjected to a heat treatment to obtain a precursor oxide, such as BSCCO 2212, e.g., the "billet packing" step of FIG. 1. Alternatively, the precursor compounds may be prereacted to form BSCCO 2212 and secondary phases prior to loading into the metallic tube.

Alternatively, a metallic powder in tube (MPIT) process may be used in which metal or alloy powders are used to form the BSCCO 2212 precursor. See, Otto et al. "Properties of high Tc wires made by the metallic precursor process", JOM, 45(9):48 (September 1993), for further details. The metal sources are added in proportions substantially stoichiometric for the final oxide superconductor. Additional noble metal may be added on the order of 0–70 wt %. Further detail on the processing of multifilamentary oxide superconductor composites may be found in International Application No. WO 99/07004, published Feb. 11, 1999, and entitled "Fine Uniform Filament Superconductor", the contents of which are hereby incorporated by reference.

Figure 1:
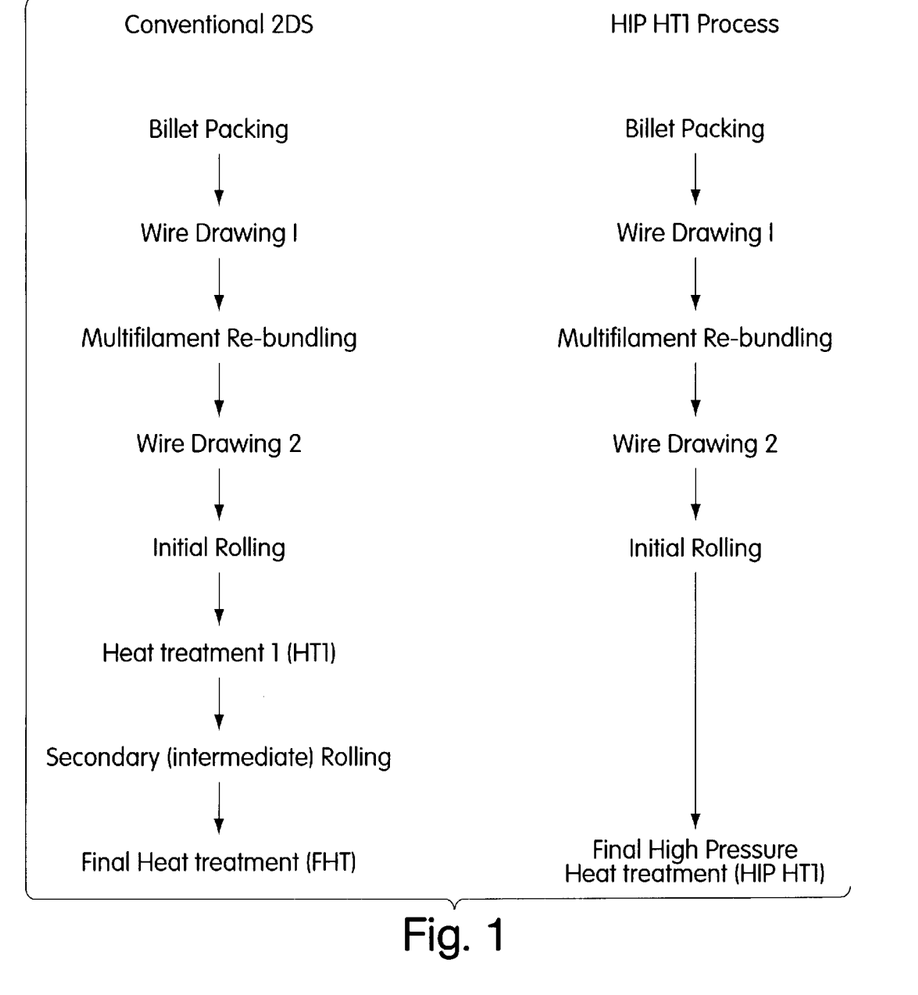
FIG. 1 is a flow diagram indicating the processing sequence for a conventional wire process and the process of the invention

The tube is then extruded or drawn into a wire of smaller dimension, e.g., the "wire drawing 1" step of FIG. 1. In the case of a multifilamentary wire, a hexagonal cross-section may be used due to its efficient stacking ability, and the extruded or drawn wire is then repacked into another metallic tube, e.g., the "multifilament re-bundling" step of FIG. 1, and extruded or drawn again to obtain a multifilament of reduced cross-section, e.g., the second "wire drawing 2" step of FIG. 1. The process of repacking and extruding or drawing the multifilamentary wire is carried out until the desired number of filaments is attained and at least one dimension of each filament has obtained the desired dimension (typically a function of the oxide grain length). Alignment of the superconducting oxide grains has been observed in long, thin filaments constrained within a metal matrix. In one embodiment, the oxide filament is of a dimension on the order of the longest dimension of the oxide superconductor grain. See, International Application No. WO 92/18989, entitled "A Method of Producing Textured Superconducting Oxide Bodies by the Oxidation/Annealing of Thin Metallic Precursors" filed Oct. 29, 1992, the contents of which are incorporated by reference.

BSCCO 2212 may be prepared having either an orthorhombic or tetragonal solid state lattice symmetry. In preferred embodiments, it may be desirable to use the tetragonal phase of the BSCCO 2212 oxide superconductor in the formation of the multifilament wire, because it has been observed previously that tetragonal BSCCO 2212 performs well in wire forming operations. This may be because the tetragonal phase, having identical a and b axes, responds better to more symmetric deformations and/or because the packing density of the tetragonal phase of BSCCO 2212 is greater than the corresponding orthorhombic phase. The tetragonal phase therefore packs well into the metallic tubes used in the OPIT process to form homogeneously packed powders which can be further densified upon extrusion or drawing. The orthorhombic phase of BSCCO 2212, on the other hand, undergoes densification or texturing to a much greater extent than the corresponding tetragonal phase, resulting in a denser, less porous oxide grain structure when subjected to asymmetric deformation operations. Thus, in preferred embodiments, a filamentary wire is formed using tetragonal phase BSCCO 2212, which is phase converted into orthogonal phase BSCCO 2212 prior to texturing. See, U.S. Pat. No. 5,942,466, issued Aug. 4, 1999, and entitled "Processing of (Bi,Pb)SCCO Superconductors in Wires and Tapes," the contents of which are incorporated by reference, for further details.

According to the method of the invention, a multifilamentary article containing the precursor to an oxide superconductor is processed to obtain a highly textured grain structure. The precursor to the oxide superconductor is selected for its ability to be oriented or textured. BSCCO 2212 in particular may be textured using a variety of techniques. For example, texture may be introduced by reaction conditions and/or deformation. In reaction-induced texture (RIT), processing conditions are chosen which kinetically favor the anisotropic growth of the oxide grains. Reaction-induced texture can occur in a solid phase system or, preferably, in a solid-plus-liquid phase system. BSCCO 2212 undergoes a reversible melt at elevated temperatures, which is well-suited for RIT. When BSCCO 2212 is reaction-textured, the oxide material decomposes completely and a textured oxide superconductor is grown from the melt. The presence of a liquid greatly increases the kinetics of anisotropic grain growth, probably through increased rates of diffusion of the oxide components. Deformation-induced texture (DIT) occurs by applying a strain to the oxide grains to induce alignment of the oxide grains in the plane or direction of elongation. Deformation-induced texture requires anisotropic grains in order to effect a preferential alignment of the grains. Orthorhombic BSCCO 2212 is the preferred oxide precursor for deformation-induced texturing.

Figure 2:
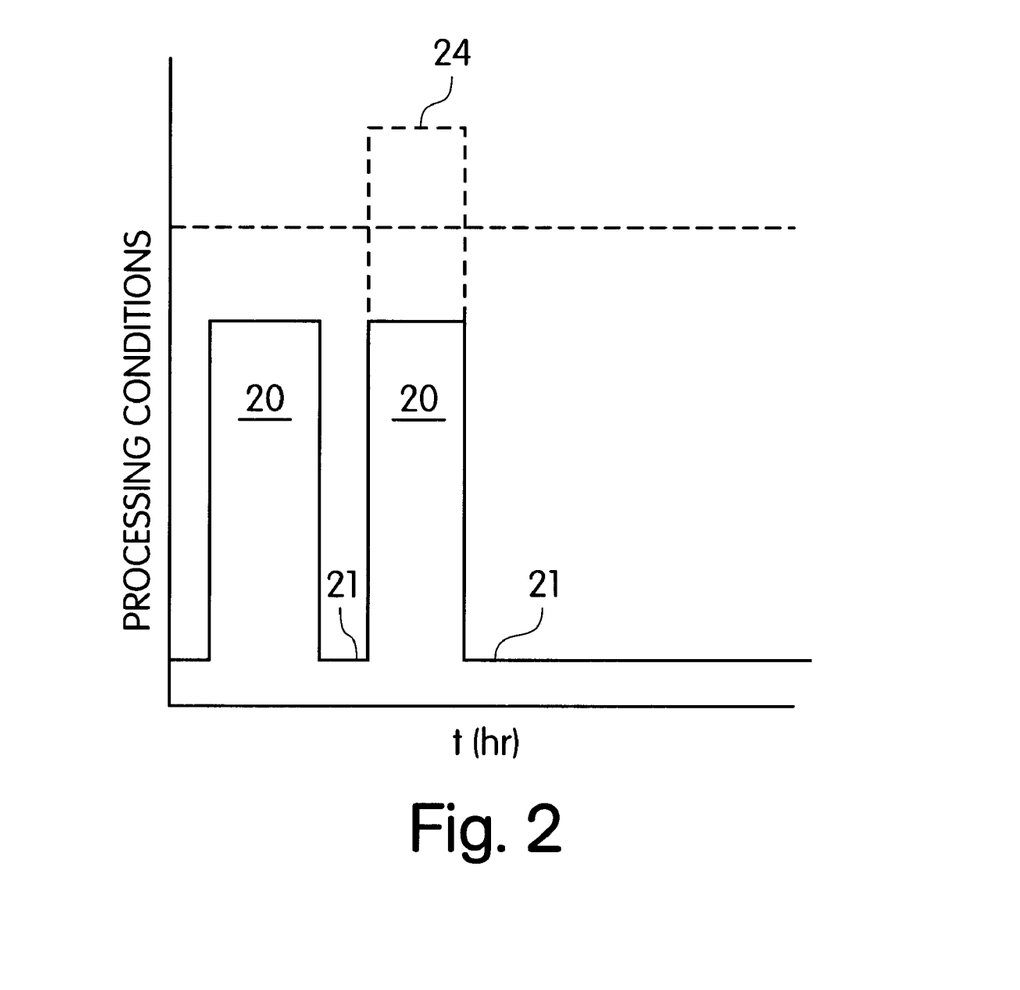
FIG. 2 is a processing profile for obtaining highly textured articles.

FIG. 2 illustrates a processing profile for a method of the invention used to obtain highly textured articles. In the first step, an oxide superconductor precursor is subjected to one or more anneal and deformation iterations, denoted by step 20 and step 21, respectively. The anneal 20 serves two purposes. Firstly, it serves to form the precursor oxide orthorhombic BSCCO 2212 which is to be textured (in those instances where it has not already been formed). Secondly, it is also possible to adjust the processing conditions to promote partial melting during the anneal, indicated by step 24 to assist in grain growth and enhance reaction-induced texture. An anneal in the range of 800–860° C. in 0.075 atm ($7.5 \times 10^{-4}$ MPa) $O_2$ (total pressure 1 atm) is typical for partial melting to occur. The deformation 21 of the article promotes deformation induced texturing. Suitable texture-inducing deformations include asymmetric deformations, such as rolling and pressing. One or more anneal-deformation iterations may be performed.

In a preferred embodiment, a high reduction rolling process is used to highly texture the multifilamentary article, e.g., the "initial rolling" step of FIG. 1. A high reduction rolling operation has been shown to be highly effective in producing a high density, highly textured oxide phase. The single deformation step introduces a high level of deformation strain, e.g., 40–95%, and preferably >90% strain, by reducing the article thickness by 40–95% in a single step. The high reduction process completely distributes the deformation energy throughout the article. Thus, the entire filament experiences similar densifying and texturing forces, leading to greater filament uniformity and degree of texture. Such processing additionally has been found to eliminate undesirable non-uniformities along the length of the oxide filaments, while providing consistently better electrical transport properties in the final article, regardless of the particular method used to obtain the final oxide superconducting phase. As a further advantage, the process provides a densified and textured precursor oxide in a single anneal and deformation step, as compared to more traditional methods of precursor processing which involve multiple anneal and deformation steps. Further information on a single step deformation process may be found in International Application No. WO 96/39366, published Dec. 12, 1996, entitled "Simplified Deformation-Sintering Process for Oxide Superconducting Articles, which is hereby incorporated by reference.

The resultant precursor oxide is then highly textured and highly dense. In preferred embodiments, the highly textured precursor has an f-factor value of at least 0.7, more preferably at least 0.8 and most preferably at least 0.9. In the preferred processing methods described herein to obtain a highly textured oxide, f-factors on the order of 0.95 are attainable. In other preferred embodiments, the highly dense precursor is at least 70% dense relative to theoretical. Preferably, highly dense oxides possess a density that is greater than 80%, and most preferably greater than 90% dense, relative to theoretical (in which the material has no pore space or voids).

The highly textured and dense precursor is then heated under conditions that convert the precursor into the desired oxide superconductor. In conventional processes, BSCCO 2212 and secondary phases are converted into BSCCO 2223 under one atmosphere of pressure, i.e., the "heat treatment (HT1)" step of FIG. 1, and the oxide phase expands (dilates) and experiences a decrease in both density and degree of texture. Conventionally processed mono- and multifilamentary tapes typically demonstrate an increase in overall thickness of greater than 8%, and have ranged as high as 47%. See Examples. Thickness increase is attributed to the dilation effects discussed herein.

According to the method of the invention, dilation of the oxide phase is substantially avoided and near net shape is substantially retained by applying an opposing force to the multifilamentary article during phase conversion, e.g., the "final high pressure heat treatment (HIP HT1)" of FIG. 1. The constraining force is selected to match approximately the expansion force experienced by the multifilamentary composite during heating. The resultant oxide superconductor has substantially the same degree of texture or oxide density as the pretextured precursor prior to phase conversion. Preferably, the oxide superconductor has substantially the same degree of texture and oxide density as the precursor prior to phase conversion.

"Substantially the same," as applied to density, refers to a change in density of less than 20%, and preferably less than 10%, and most preferably less than 5%.

"Substantially the same," as applied to thickness (and volume if the thickness is uniform) is considered to be less than 7%, preferably less than 6%, and preferably less than 3%, and most preferably less than 1.5%, of the pretextured precursor values, as measured along the direction of transverse elongation.

"Substantially the same," as applied to texture refers to a change in texture of less than 10%, preferably less than 5%, and most preferably less than 2.5% of the pretextured precursor.

The constraining force may be uniaxially applied, i.e., in a single direction, or is may be isostatically applied, i.e., uniform in all directions. Hot pressing is less preferred because it is not readily scalable to large manufacturing processes and because greater care must be taken to avoid overdeforming, which may cause cracking in the article.

In preferred embodiments, an isostatic pressure is used as the constraining force. When used at elevated temperature conditions, the process is known as hot isostatic pressing (HIP). In preferred embodiments, pressures may be in the range of about 10–2500 atm (1–250 MPa), and preferably about 25–100 atm (2.5–10 MPa). In other preferred embodiments, improvements in density and texture retention during phase conversion have been observed for pressures in the range of about 40–85 atm (4–8.5 MPa). Pressure is applied at a temperature and an oxygen partial pressure that facilitates phase conversion of the precursor into the oxide superconductor.

Phase conversion of BSCCO 2212 into BSCCO 2223 may be carried out over a wide processing range. Preferred processing conditions include heating the article at a temperature of substantially in the range of 815° C. to 860° C. at a $P_{O2}$ substantially in the range of 0.001 to 1.0 atm ($10^{-4}$–$10^{-1}$ MPa). The exact processing temperature may vary dependant upon the oxygen partial pressure and the total overpressure of the system. In preferred embodiments, the oxygen partial pressure is in the range of 0.001–1.0 atm ($10^{-4}$–$10^{-1}$ MPa); and is preferably in the range of 0.01–0.25 atm (1–25×$10^{-3}$ MPa). To achieve the desired $P_{O2}$, the fugacity equation for oxygen is used in which the fugacity of oxygen is a function of both temperature and total pressure. Oxygen fugacity is nominally equivalent to the partial pressure of oxygen under these conditions. The desired oxygen partial pressure may be obtained by using a low oxygen content gas and adjusting the total pressure, as desired. The balance of the gas is an inert gas such as nitrogen or argon, which is used to bring the total pressure into the desired range. For example, a 0.1% oxygen/inert gas mixture may be pressurized to 100 atm (10 MPa) to provide an environment having $P_{O2}$=0.1 atm ($10^{-2}$ MPa).

Conditions under which BSCCO 2223 may be formed or is thermodynamically stable may be used in the practice of the invention. The phase stability at elevated pressures of the high Tc oxide superconductor in the Bi—Sr—Ca—Cu—O family has been investigated and this knowledge may be applied in selecting conditions for the simultaneous pressing and phase conversion of an oxide precursor to the final oxide superconductor. Ishizaki, in "Phase Diagrams under High Total Gas Pressures," *Acta Metallurgical Materials*, 38(11):2059 (1990) (hereby incorporated by reference), has investigated the formation of BSCCO 2223 at different oxygen partial pressures and total pressures, which is useful in identifying suitable conditions to effect phase conversion of the textured precursor to BSCCO 2223. Allemeh and Sandhage in "Effect of High-temperature, High-oxygen-fugacity Annealing on the Stability of the $(Bi,Pb)_2Sr_2Ca_2Cu_3O_{10\pm\delta}$-type Compound" (presented at the 96th Annual Meeting of the American Ceramic Society, Indianapolis, Ind., Apr. 27, 1994; Paper E-59-94, and hereby incorporated by reference) also provide information on the stability of BSCCO 2223 at high pressure, which is useful in the selection of appropriate heat conditions to convert the precursor into the final oxide superconductor.

In a preferred embodiment, processing of the BSCCO 2212 (plus secondary phases) precursor into BSCCO 2223 is accomplished under conditions, which partially melt the oxide such that the liquid co-exists with the final oxide superconductor. During the partial melt, non-superconducting material and precursor oxide phases melt and the final oxide superconductor is formed from the melt. The heat treatment thus is conducted in two steps, in which (a) a liquid phase is formed such that the liquid phase co-exists with the final oxide superconductor; and (b) the liquid phase is transformed into the final oxide superconductor.

The above process has been found to advantageously heal any cracks or defects, which may have been introduced into the oxide superconductor filaments, particularly during any deformation operation. The liquid is believed to "wet" the surfaces of cracks located within and at the surfaces of the oxide grains. Once the conditions are adjusted to transform the liquid into the final oxide superconductor, oxide superconductor is formed at the defect site and "heals" the defect. In an exemplary method, the processing conditions are first adjusted to bring the article under conditions where a liquid phase is formed. It is desired that only a small portion of the oxide composition be transformed into a liquid so that the texturing introduced in previous steps is not lost. In the BSCCO system, in general a temperature in the range of 815–860° C. may be used at a $P_{O2}$ in the range of 0.001–1.0 atm ($10^{-4}$–$10^{-1}$ MPa). In preferred embodiments, conditions of 820–835° C. at 0.075 atm (7.5×$10^{-3}$ MPa) $O_2$ are sufficient. The processing parameters may then be adjusted to bring the article under conditions where the liquid is consumed and the final oxide superconductor is formed from the melt. In general, a temperature in the range of 780–845° C. may be used at a $P_{O2}$ in the range of 0.01–1.0 atm ($10^{-3}$–$10^{-1}$ MPa). In preferred embodiments, conditions of 790–820° C. at 0.075 atm (7.5×$10^{-3}$ MPa) $O_2$ are sufficient. See, U.S. Pat. No. 5,635,456, issued Jun. 3, 1997 and entitled "Processing for Bi/Sr/Ca/Cu/O-2223 Superconductors," which is hereby incorporated by reference, for further details.

The above-described high pressure, phase converting heat treatment accomplishes in a single step that which a conventional heat treatment requires three steps to accomplish. Referring again to FIG. 1, the final high pressure heat treatment (hereinafter referred to as "HIP HT1") provides a high density, high purity BSCCO 2223 superconducting wire, whereas a conventional process requires a first phase converting heat treatment (hereinafter "HT1"), a second rolling step (hereinafter "intermediate" rolling) and a final heat treatment (hereinafter "FHT"). This represents a considerable savings in both time and resources. As is shown in the examples below, this is accomplished without any loss of superconducting performance. Indeed, transport properties of the superconducting wire were shown to improve under certain conditions.

Figure 3:
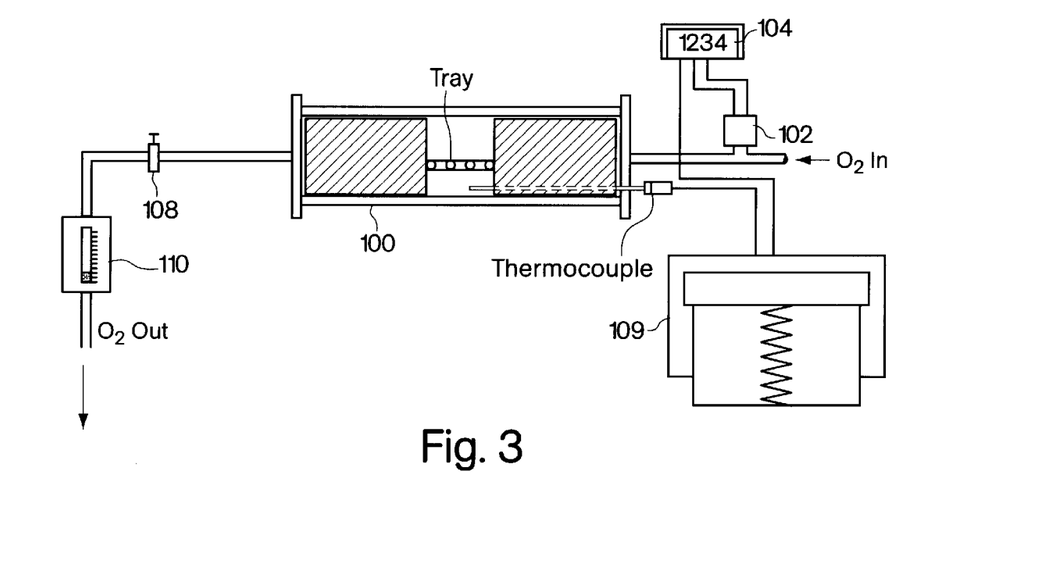
FIG. 3 is a schematic illustration of an apparatus used in the simultaneous constraint-reaction process.

The method is described with reference to FIG. 3, which is a schematic illustration of an apparatus used in the invention. The simultaneous reaction and constraint is carried out in an autoclave, furnace or similar apparatus 100, capable of attaining high pressurization at controlled temperatures. The internal pressure of the furnace is monitored using a pressure transducer 102 and a pressure meter 104 which are in-line with the furnace. A chart recorder or other recording means optionally monitors internal pressure of the furnace.

Because total pressure of the system is related to the partial pressure of oxygen to which the sample is exposed during phase conversion, it is desired that the total pressure be maintained at a constant value during the heat treatment. In a constant volume (represented by the furnace interior), variations in pressure naturally will occur as the temperature is varied unless steps are taken to control furnace pressure. The present invention appreciates the relationship and, hence, importance of the control of both the total pressure ($P_{total}$) and the oxygen partial pressure during phase conversion.

In conventional BSCCO 2223 wire heat treatments, the wire first expels and then consumes oxygen during BSCCO 2223 phase conversion. To assure that (i) this reaction also occurs in high pressure processing and (ii) minor amounts of oxidation of the retort does not affect the local oxygen concentration, a 'flow through' HIP system may be used. The high pressure gas exchange was achieved by incorporating a high pressure needle valve near the gas exit location of the furnace, allowing a low volume of gas to flow through the furnace while maintaining pressure.

To address these process-related pressure issues and to prevent stagnant air (atmosphere) from accumulating in the furnace (and thereby loss of control over $P_{total}$ and $P_{O2}$), a micro-controlled needle valve 108 is included at the exit to the furnace, which is connected to a flow meter 110, which monitors and controls the flow rate of the gas out of the furnace. The use of a micrometering valve allows very low flow rates out of the furnace. In a typical heat treatment, flow rates of 0.3–0.6 scfh are used. The overall effect of this is to create a "leak" effect, which eliminates stagnation in the furnace and keeps the total pressure and the $P_{O2}$ over the sample constant.

In other preferred embodiments, additional means of controlling the flow of gas through the furnace may be provided in order to permit a greater degree of control over $P_{total}$ and $P_{O2}$. Thus, feedback may be provided from the flow meter to the micrometering valve to close or open the valve in response to changes in furnace pressure. Fine tuning of gas flow may be appropriate during heating and cooling steps where the temperature of the gas flowing through the valve will alter the size of the valve aperture.

Figure 4:
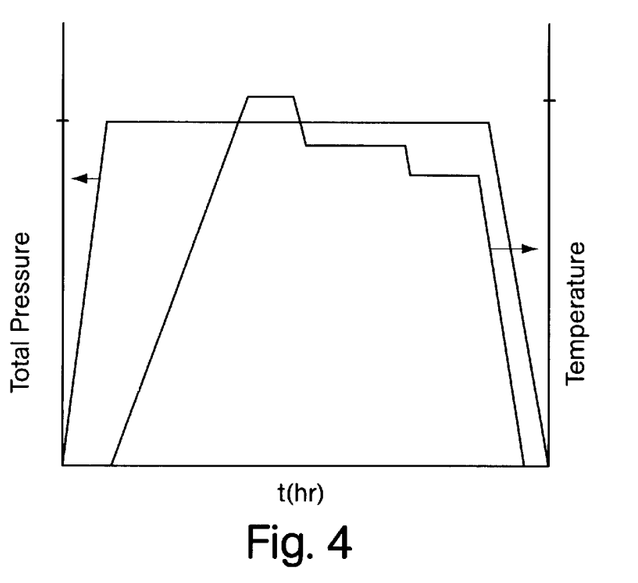
FIG. 4 are pressure and temperature vs. time curves used in the formation of the high Tc oxide superconductor at elevated pressures.

A general processing profile for the simultaneous reaction and constraint heat treatment is shown in FIG. 4. The furnace is initially pressurized to the desired total pressure. The oxygen/inert gas mixture is determined by the desired partial pressure of oxygen as described herein above. Alternatively, when using standard oxygen/gas mixtures, the total pressure may be selected to provide the desired oxygen partial pressure. The temperature is raised to a predetermined value as shown in FIG. 4 selected as being capable of converting the precursor into the final oxide superconductor at the predetermined $P_{O2}$. The metering valve bleeds off gas pressure in the furnace to accommodate the temperature increase so as to maintain a constant pressure. The sample is heated for a time sufficient to convert the precursor into the final oxide superconductor. The temperature may be held constant, or it may be stepped through a series of temperature ranges, such as described herein above to partially melt and then reform the oxide superconductor phase or other heating profiles.

The resultant mono- or multifilamentary oxide superconductor article demonstrates similar thickness and density profiles before and after phase converting heat treatments. The article shows increases in thickness of less than 7%, less than 6%, and preferably in the range of 1–5%, along the direction transverse to elongation. This small increase in thickness translates into insignificant changes in the near net shape of the article before and after phase converting heat treatments.

Near net shape is defined as the external physical dimensions of the filamentary article. Because the length of the article is not greatly affected by the processing described herein, the near net shape is defined by the cross-sectional shape of the article as measured by the external perimeter of the article cross-section. In preferred embodiments, articles of the invention demonstrate overall changes in near net shape of less than 1% due to phase conversion, i.e., the external physical dimensions of the article remain substantially unchanged. Minor changes in near net shape are highly advantageous as it allows one to set the dimensions of the final product early on in the process in forming the precursor.

Because the constraining force applied to the article during phase conversion does not alter the dimension or shape of the article, the outer surface of the filaments appears defect-free and lacks irregularities of the surface associated with conventional processes. For example, the article surfaces are flat across both the upper and lower surfaces of the tapes. There is no bowing or curving outwards of the tape surface due to blistering (resulting from the outwardly expanding forces of the dilating oxide phase). Nor are there any concavities on the surface, which are the result of excessive force experienced by the tapes during deformation steps conducted subsequent to oxide superconductor phase formation in order to redensify the oxide phase.

In addition, the article possesses highly dense, highly textured oxide superconductor filaments that are substantially crack-free and defect-free. The oxide phase is of a significantly higher quality with respect to cracking and other defects because no corrective deformation was used after BSCCO 2223 phase formation. Oxide superconducting articles of the invention exhibit at least 80%, and preferably 90%, theoretical density for BSCCO 2223 and an f-factor of greater than 0.7, preferably greater than 0.8 and more preferably greater than 0.9. The wires exhibit good electrical transport properties, as is demonstrated in the Examples.

The invention is described in the following examples, which are presented for the purpose of illustration and which are not limiting of the invention, the full scope of which is set forth in the claims.

EXAMPLE 1

This example compares the extent of multifilamentary oxide superconductor expansion in tapes prepared using conventional methods and the simultaneous reaction-constraint conditions in accordance with the present invention.

A precursor filament was prepared by filling a silver tube with precursor powders including tetragonal BSCCO 2212 and BSCCO 0011, necessary to provide a precursor having the appropriate stoichiometry of the produce oxide superconductor BSCCO 2223. The powder-in-tube was drawn to a wire of smaller dimensions, and then a plurality of wires were bundled and redrawn to provide a multifilamentary wire having 85-filaments. Typically, such multifilamentary wires have a dimension of 0.035" (35 mil, 0.89 mm). The precursor oxide was heat treated to convert tetragonal phase BSCCO 2212 into orthorhombic phase BSCCO 2212. Lastly, the precursor was densified and textured in a single large reduction rolling operation, which resulted in a multifilamentary tape having a thickness of 0.00636" (6.36 mil, 0.162 mm). Typically, large reduction rolling operations on this scale produce oxide precursor tapes having about 90% density and an f-factor of about 0.9.

A single long length of the BSCCO 2223 precursor tape was cut into identical short lengths. Each length was heat treated identically, with the exception of the total gas pressure. The sample tapes were introduced into the furnace and pressurized to the desired level. Once the desired pressure was attained, the furnace was heated at a ramp rate of 10° C./min to the reaction temperature of 820° C. All tapes were processed under an oxygen partial pressure of 0.075 atm ($7.5 \times 10^{-3}$ MPa) using the heat sequence as follows: (a) 827° C. (40 h); (b) 808° C. (40 h); and (c) 724° C. (30 h), which is effective to complete conversion of the precursor oxide into BSCCO. Tape thickness was measured before and after heat treatment to determine the extent of tape dilation. Tape thickness before heat treatment was 0.00636 (6.36 mil, 0.162 mm). Tape thickness after heat treatment is reported in Table 1, along with % increase in thickness and $J_e$.

TABLE 1

| Sample no. | Total pressure (atm = 0.1 MPa) | Average thickness (×0.001") | increase in thickness (%) | $J_e$ (amp/cm$^2$) |
|---|---|---|---|---|
| 1-1 | 1 | 6.88 | 8.39 | 9629 |
| 1-2* | 1 | 6.98 | 9.97 | 9416 |
| 1-3* | 41 | 6.68 | 5.12 | 10539 |
| 1-4* | 41 | 6.74 | 6.17 | 10332 |
| 1-5** | 41 | 6.74 | 6.14 | 10283 |
| 1-6 | 41 | 6.67 | 4.99 | 10582 |

*end-sealed using molten silver
**end-sealed using crimping

The procedure was repeated on an 85-filament tape of similar composition and processing to that described above. However, initial tape thickness after large reduction rolling was larger 0.00665" (6.65 mil, 0.169 mm), so that the degree of texture and density was smaller. Typically, tapes processed according to this method have a degree of texture of about 0.8 and density of about 80%. Results for the tape lengths are reported in Table 2.

TABLE 2

| Sample no. | Total pressure (atm = 0.1 MPa) | Average thickness (×0.001") | increase in thickness (%) | $J_e$ (amp/cm$^2$) |
|---|---|---|---|---|
| 2-1 | 1 | 7.18 | 7.89 | 9571 |
| 2-2 | 1 | 7.26 | 9.15 | 9472 |
| 2-3 | 41 | 6.96 | 4.64 | 10953 |
| 2-4 | 83 | 6.73 | 1.13 | 11125 |

This series of examples demonstrates the benefit of the method of the invention on samples of even lower density and texture.

The procedure was repeated on an 85-filament tape of similar composition and processing to that described above. However, initial tape thickness after large reduction rolling was smaller 0.00575" (5.75 mil, 0.146 mm), so that the degree of texture and density was higher. In addition, the fill factor (the percent of the multifilamentary composite which is oxide superconductor) was lower than for the previous examples. In this series of samples, the fill factor was 24%, compared to 30% for the 1- and 2-series samples. Results for the tape lengths are reported in Table 3.

TABLE 3

| Sample no. | Total pressure (atm = 0.1 MPa) | Average thickness (×0.001") | increase in thickness (%) | $J_e$ (amp/cm$^2$) |
|---|---|---|---|---|
| 3-1 | 1 | 6.28 | 9.13 | 6531 |
| 3-2 | 1 | 6.43 | 11.74 | 5616 |
| 3-3 | 1 | 6.71 | 16.67 | 5192 |
| 3-4 | 47 | 5.88 | 2.32 | 7204 |
| 3-5 | 83 | 5.91 | 2.75 | 6669 |

The procedure was repeated on an 85-filament tape of similar composition and processing to that described above. However, initial tape thickness after large reduction rolling was smaller 0.0048 (4.80 mil, 0.122 mm), so that the degree of texture and density was higher. The degree of texture (>0.9) and density (>90%) were quite high due to the very large deformation rolling operation used. The fill factor (the percent of the multifilamentary composite which is oxide superconductor) was comparable to that of the 1- and 2-series samples (30%). Initial tape thickness was 4.80 mil. Results for the tape lengths are reported in Table 4.

TABLE 4

| Sample no. | Total pressure (atm = 0.1 MPa) | Average thickness (×0.001") | increase in thickness (%) | $J_e$ (amp/cm$^2$) |
|---|---|---|---|---|
| 4-1 | 42 | 5.25 | 3.69 | 10924 |
| 4-2 | 83 | 5.20 | 3.28 | 11260 |

In summary, samples treated under high total pressures demonstrated much smaller increases in tape thickness, e.g., in the range of 1–6%. In contrast, samples conventionally treated at 1 atm (0.1 MPa) total pressure showed increases in tape thickness ranging from 8–16%. These differences were reflected in the generally superior critical current densities of the samples processed under high total pressure.

EXAMPLE 2

This example investigates the effectiveness of the high total gas pressure on a tape having a different configuration.

BSCCO 2223 precursor tapes having a stack configuration, i.e., the individual oxide filaments are stacked on top of one another in the composite instead of being offset from one another in a more conventional configuration, were treated according to the method of the invention. The multifilamentary tape was prepared as described for the series-I samples of example 1, except that the filaments were bundled to give a stack configuration (giving them a different starting thickness). In addition, the tapes were rolled to different initial thicknesses, representing different degrees of texture and density in the precursor oxide. In general, tapes rolled to an initial thickness of 0.0058" (5.8 mil, 0.142 mm) and 0.0062" (6.2 mil, 0.152 mm) had an f-factor of about 0.8, while tapes rolled to an initial thickness of about 0.00495" (4.95 mil, 0.121 mm) and 0.00535" (5.35 mil, 0.0131 mm) had an f-factor of about 0.9.

A single long length of BSCCO 2223 precursor tape was cut into identical short lengths. Each length was heat treated identically, except for the total gas pressure. The sample tapes were introduced into the furnace and pressurized to the desired level. Once constant pressure was attained, the furnace was heated at a ramp rate of 10° C./min to the reaction temperature of 828° C. All tapes were processed using the heat treatment protocol of Example 1, except that a slow ramp was used in step (a) between 830° C. and 820° C. over 40 hours. Tape thickness was measured before and after heat treatment to determine the extent of tape expansion and filament puffing. Tape thicknesses before and after heat treatment were measured and are reported in Table 5, along with % increase in thickness and $J_e$.

TABLE 5

| Sample no. | Total pressure (atm = 0.1 MPa) | Starting thickness (×0.001") | Final thickness (×0.001") | increase in thickness (%) | $J_e$ (amp/cm$^2$) |
|---|---|---|---|---|---|
| 5-1 | 1 | 6.2 | 6.99 | 13 | 7031 |
| 5-2 | 1 | 5.8 | 6.78 | 17 | 6497 |
| 5-3 | 1 | 5.35 | 7.19 | 34 | 5412 |
| 5-4 | 1 | 4.95 | 7.28 | 47 | 4491 |
| 5-5 | 72 | 6.2 | 6.54 | 5 | 7306 |
| 5-6 | 72 | 5.8 | 6.00 | 3 | 8102 |
| 5-7 | 72 | 5.35 | 5.63 | 5 | 7095 |
| 5-8 | 72 | 4.95 | 5.28 | 7 | 6604 |

As in Example 1, samples treated under high total pressures demonstrated much smaller increases in tape thickness, e.g., in the range of 3–7%. In contrast, samples conventionally treated at 1 atm total pressure showed increases in tape thickness ranging from 13–47%. The larger increase in thickness in these samples may be due to the configuration of the oxide filaments. By stacking the filaments one on top of the other, the increases in each individual filament thickness are additive. These differences were reflected in the generally superior critical current densities of the samples processed under high total pressure.

EXAMPLE 3

This example compares the process of the reaction and constraint process of the invention with a process using deformation as a separate step in the process.

A single long length of tape similar to that used in Example 2 was cut into identical short lengths. Each length was heat treated identically at one atmosphere (0.1 MPa) total pressure and 7.5% oxygen. The furnace was heated at a ramp rate of 10° C./min to the reaction temperature of 828° C. The samples were heat treated according to the protocol described for the 1-series in Example 1 to convert the precursor BSCCO 2212 oxide into BSCCO 2223. The sample was treated for 25 hours under the conditions of step (a) of Example 1, and then the sample was given an intermediate rolling deformation of 10% reduction of the original thickness. This is considered to be a low strain deformation, but is sufficient to eliminate the initial tape expansion due to the heat treatment. The tape was then heated for the time remaining in step (a) and further heat treated according to Example 1 to complete conversion of the sample to the final oxide superconductor. Tape thickness was measured before and after heat treatment, and after the intermediate deformation to determine the extent of tape expansion and filament puffing. Tape thickness after intermediate rolling and after complete heat treatment is reported in Table 6, along with % increase in thickness and $J_e$.

TABLE 6

| Sample no. | Starting thickness (× 0.001") | Thickness after intermediate rolling (× 0.001") | Thickness after heat treatment (× 0.001") | Δ thickness initial-final (%)[a] | Δ thickness intermediate-final (%)[b] | $J_c$ (amp/cm²) |
|---|---|---|---|---|---|---|
| 6-1 | 6.2 | 5.75 | 6.38 | 3 | 11 | 6287 |
| 6-2 | 5.8 | 5.35 | 5.98 | 3 | 12 | 6857 |
| 6-3 | 5.35 | 4.95 | 5.56 | 4 | 12 | 4539 |
| 6-4 | 4.95 | 4.60 | 5.19 | 5 | 13 | 5241 |

[a]Δ thickness initial-final = final-initial/initial (all in thickness)
[b]Δ thickness intermediate-final = final-intermediate/intermediate (all in thickness)

Total increases in thickness are significantly reduced when an intermediate deformation is used between phase converting heat treatments. In fact, total increase in thickness is on the same scale as the samples that were processed using the reaction and constraint method of the invention. However, these results reflect a 10% reduction in thickness introduced by rolling. Furthermore, the difference in thickness between the intermediate-rolled tape and the final tape is very high (ranging 11–13%). This is the figure of merit when considering the effect of the process on tape expansion. The effect of this significant tape expansion is reflected in the $J_e$ values for these samples, which are considerably lower than those of Example 2 prepared from the same tape.

The above examples are intended to be exemplary and non-limiting. In alternative embodiments, the step of simultaneous constraint and phase conversion may be followed by subsequent processing steps. For example, addition thermomechanical steps (as described herein above) may be used to further refine the superconducting properties of the article. In addition, post processing steps, including cabling, winding, laminating, and the like, and any post-processing heat treatments associated with these processes are contemplated.

In conclusion, processes which alternate heat treatment with deformation may not indicate a large overall increase in thickness; however, oxide density is nonetheless reduced and electrical transport properties are compromised. This is due to the fact that a significant degree of dilation may occur in the last stage of heat treatment. It also suggests that damage done to the tape by deformation, such as intergranular and intragranular cracking, is not healed in the last heat treatment. The present invention overcomes these shortcomings utilizing the processes described hereinabove to produce superconductor articles exhibiting near net shape relative to the precursor article.

EXAMPLE 4

This example compares the electrical performance of a multifilamentary oxide superconductor in tapes prepared using conventional processes and the simultaneous sinter-constraint conditions of the present invention.

Lengths of standard 55 filament Bi-2223 multifilament wire (#OX2636) having an outer diameter of 0.054" (1.37 mm) were obtained from American Superconductor's production line after the initial rolling operation. The wire was obtained using an OPIT process substantially as described in the 1-series of Example 1. This wire was used as feedstock for all furnace qualification, experimental and control samples described in this example. The wire was processed using a standard production process including a large reduction rolling operation, heat treatment at total pressure of 1 atm and 7.5% $O_2$, rolling at an intermediate reduction, and a final heat treatment at a total pressure of 1 atm and 7.5% $O_2$. This process is referred to as a conventional "2DS" process. Ic and Je performance of this wire was 126 A and 14,900 A/cm2 (77 K, self field, 1 $\mu$V/cm), respectively.

The partial pressure of oxygen ($P_{O2}$) was a processing parameter investigated in this example. All atmospheric pressure runs were carried out using a flowing gas of 7.5% oxygen, balance nitrogen. All hot isostatic pressure (HIP) runs were carried out at 75 atmospheres (7.5 MPa) using a flowing gas of 0.1% oxygen, balance nitrogen. A 3.2 cm (1.25") OD×1.5 cm (0.59") ID Incoloy 160 tube was selected for the pressure vessel. A 3.8 cm (1.5") ID furnace was used. At 1 atm, a 3.8 cm (1.5") long hot zone (±3° C. at 827° C.) was measured.

Figure 5:
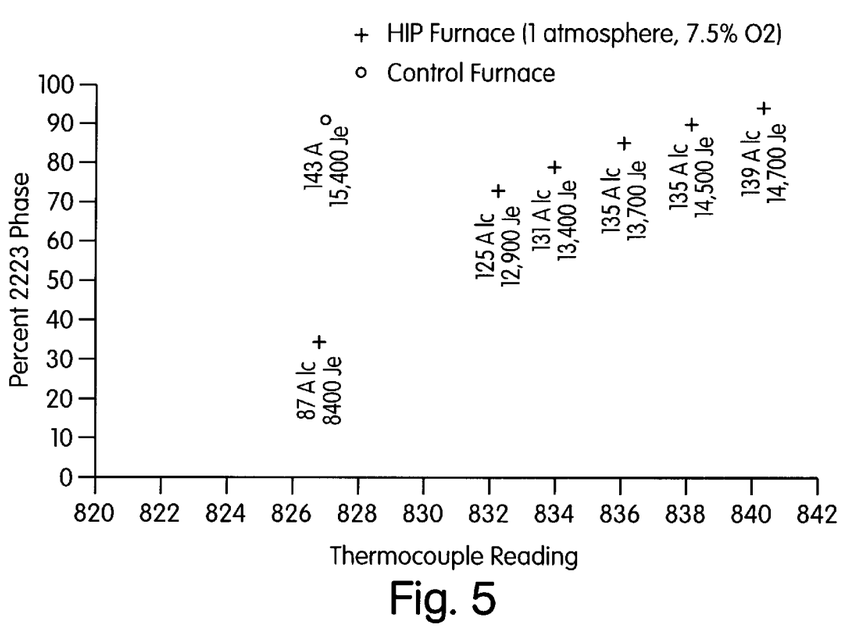
FIG. 5 is a plot of % BSCCO 2223 phase vs. temperature for samples processed in a conventional (●) and HIP furnace (+) run at 1 atm (0.1 MPa) total pressure and 7.5% oxygen in a modified 2DS process.

A series of wire tests were run to compare the HIP furnace to the conventional process development furnaces. A 'control' sample from wire OX2636 was processed in a conventional atmospheric pressure tube furnace using 7.5% oxygen at standard heat treatment temperatures and times (see above). The HIP furnace was tested by running samples at 1 atm with identical $P_{O2}$, temperature and time as the control wire. The amount of 2212 to 2223 phase conversion during the first heat (HT1) is a good indicator of the effectiveness of the heat treat cycle. The percentage of 2212 to 2223 phase is determined using X-ray diffraction and comparing relative peak heights for the 2212 and 2223 signals. Initial runs in the HIP furnace at 827° C., 7.5% $O_2$ and 1 atm did not reproduce the 2223 phase conversion observed in the control sample. Subsequent runs increased the temperature of the HIP furnace to speed the conversion. Accordingly, the percent of 2223 phase increased at higher temperatures for a set length of time. The response of phase conversion as a function of temperature is shown in FIG. 5. The difference in phase conversion between the HIP furnace at atmospheric pressure and the conventional tube furnace appears to be related to a temperature calibration offset. The 'calibration chart' of FIG. 5 was used to select appropriate processing parameters in subsequent processes.

Both the convention furnace control samples and HIP furnace samples were processed using a 'pressure controlled' intermediate deformation scheme, hereafter referred to as a "modified 2DS" process, conducted at 1 atm. The process includes a modified rolling process similar to pressing that we have previously developed so that wires with density differences after heat treat 1 (HT1) would receive similar amounts of deformation. The Ic and Je performance of product samples was measured at 77 K, self field (sf), and 1 $\mu$V/cm. All control and HIP furnace samples were run through a common modified intermediate deformation and final heat treatment process. The results are included in FIG. 5, and indicate that the overall level of performance of the modified 2DS process samples is greater than that of the standard production process (Ic=126 A), for both the control furnace and HIP furnace samples.

Figure 6:
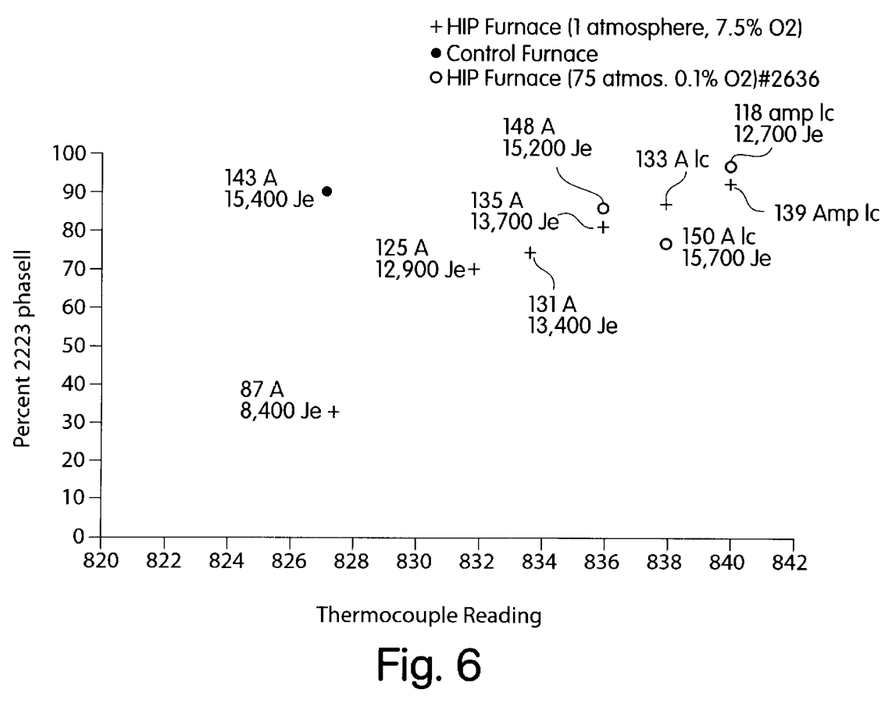
FIG. 6 is a plot of % BSCCO phase vs. temperature that compares 2223 phase conversion, Ic and Je for control (●), HIP furnace at 1 atmosphere (+) and HIP furnace at 75 atmospheres (7.5 MPa) (○) and indicates the successful transfer of 2223 reaction parameters from 1 to 75 atmospheres (0.1–7.5 MPa)

In a subsequent study, additional samples were run under HIP conditions to confirm that the ideal gas law could be applied to HIP processes at 75 atm (7.5 MPa) total pressure. Samples were run in HIP for HT1 only, at three temperatures. These were subsequently continued through a 2DS process using conventional atmospheric pressure final heat treatments (FHT), allowing isolation of the HIP heat treatment to HT1, which is hereinafter referred to as the "modified 2DS HIP" process. The 2223 phase conversion and subsequent Ic and Je data is shown in FIG. 6, indicating the 2223 reaction parameters has been successfully scaled to HIP conditions. The actual reaction temperature was slightly lower than the thermocouple readout due to the temperature offset observed in the thermocouple reading.

Figure 7A:
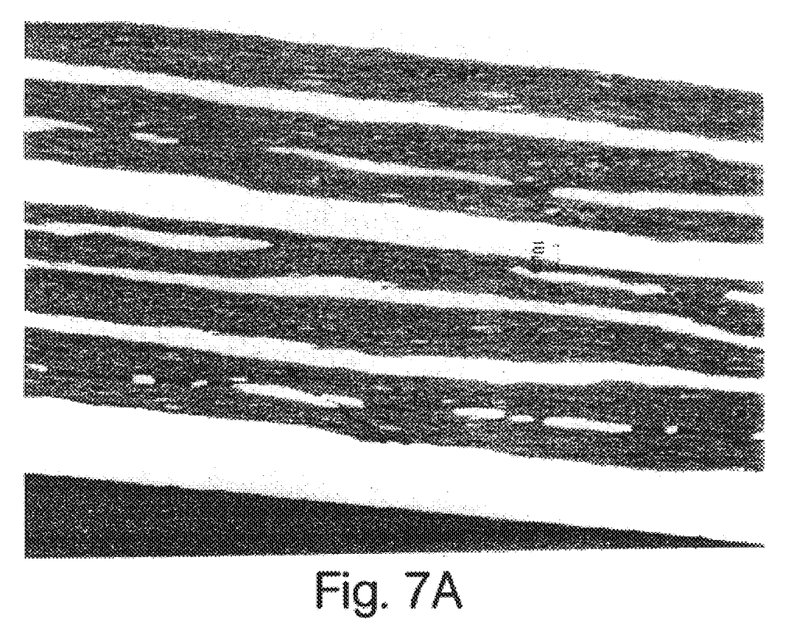
FIG. 7 is a scanning electron photomicrograph of a longitudinal cross section of a multifilament wire that has been (A) subjected to a modified 2DS process at one atmosphere, and (B) subjected to a modified 2DS HIP process at 75 atm (7.5 MPa).
Figure 7B:
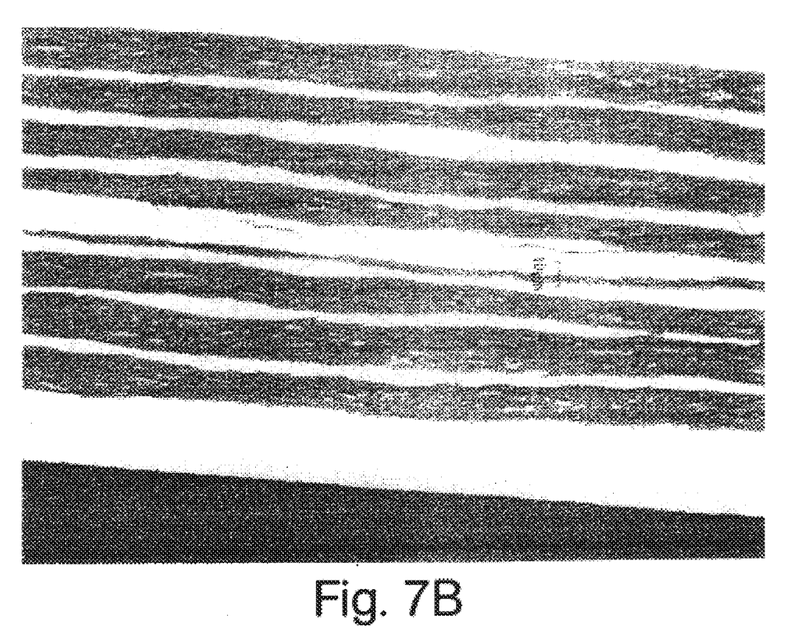

Samples from the control atmospheric modified 2DS process and modified 2DS HIP process were mounted for optical metallography. Longitudinal cross sections of these wires are shown in FIGS. 7A and 7B. The HIP tape sample (FIG. 7B) has noticeably less porosity in the HTS filaments and the filament thicknesses did not measurably change during the HIP treatment. The control tape sample (FIG. 7A) has noticeably more porosity and the filament thicknesses increased from 0.216 mm to 0.231 mm (7%) during the conventional treatment. Image analysis was performed on these mounts and fill factors for the oxide superconductor were measured. A reduction of 3% in the relative fill factor was recorded for the HIP sample compared to the control, indicating an increase in filament density. This is a significant result as no special precautions were taken to seal the ends of the wires for the HIP samples, and was also observed in the 1-series of Example 1 samples. This has significant relevance on scale-up issues as wires subjected to HIP heat treatments may not be required to be 100% defect free.

To evaluate whether or not HIP treatments could be used to reduce the overall number of steps required to produce Bi-2223 tape, a simple head to head experiment was carried out. Samples were processed through one heat treatment sequence (HIP and control at 1 atm) with no intermediate rolling operation, e.g., a 1DS process. The HIP samples resulted in an average Ic value of 130 A (a Je of 14,700 A/cm$^2$) which compared favorably to the control samples which had an average Ic value of 67 A (all values at 77 K, sf, 1 $\mu$V/cm).

The key objectives of this example were to demonstrate (1) improved electrical performance (by increasing filament density) and (2) reduced cost by eliminating process steps. As shown in Table 7, improved performance and higher filament density were observed for HIP treated samples. Moreover, basic proof of performance was demonstrated for a single deformation—HIP heat treatment '1DS' process, which has fewer process steps than the conventional iterative thermomechanical '2DS' process.

TABLE 7

| HT Condition | Process | Ic | Je |
| --- | --- | --- | --- |
| Production Process | 2DS | 126 A | 14,900 A/cm$^2$ |
| HIP | 1DS | 130 A | 14,700 A/cm$^2$ |
| HIP | Modified 2DS | 150 A | 15,700 A/cm$^2$ |
| 1 Atmosphere | 1DS | 67 A | 8,800 A/cm$^2$ |
| 1 Atmosphere | Modified 2DS | 143 A | 15,400 A/cm$^2$ |

This work clearly demonstrates the basic feasibility of improved performance for state of the art production BSCCO wires. The performance of 1DS HIP-treated samples was equivalent to that of conventionally 2DS processed control samples suggesting that significant cost savings could be achieved by replacing a conventional 2DS process with 1DS HIP heat treatments. The performance of modified 2DS HIP samples was greater than that of conventionally processed 2DS control samples, suggesting continued development opportunities for HIP treatments.

In summary, the examples demonstrate that 1) the Je performance of '1DS' HIP processed samples on par with that of standard production samples, 2) the Je performance of '2DS' HIP 'pressure controlled' intermediate deformation processed samples was 5% greater than that of standard production samples, 3) the filament density of HIP treated samples is greater than that of 1 atm treated samples, and 4) the 2223 phase conversion at 75 atm closely matches that at 1 atm.

All publications and patent applications mentioned in this specification are herein incorporated by reference to the same extent as if each independent publication or patent application was specifically and individually indicated to be incorporated by reference.

What is claimed is:

1. A method of making an oxide superconductor article, comprising:
   converting a textured oxide superconductor precursor into a selected oxide superconductor, while simultaneously applying an isostatic force to the precursor which at least matches the expansion force experienced by the precursor during conversion to the selected oxide superconductor,
   whereby near net shape of the oxide superconductor precursor is substantially retained during phase conversion.

2. The method of claim 1, further comprising;
   subjecting the oxide superconductor precursor to a texturing deformation to orient grains of the oxide superconductor precursor to obtain the textured precursor.

3. The method of claim 2, wherein no further deformation of the article takes place after the phase converting heat treatment.

4. The method of claim 2, wherein the precursor is textured using asymmetric deformation.

5. The method of claim 4, wherein the asymmetric deformation is selected from the group consisting of rolling and pressing.

6. The method of claim 5, wherein the rolling deformation results in a 40–95% reduction in thickness of the article.

7. The method of claim 2, wherein the precursor is textured using reaction-induced texturing.

8. The method of claim 7, wherein the precursor comprises BSCCO 2212 and reaction induced texturing is conducted at a temperature in the range of 800–860° C. and an oxygen partial pressure in the range of 0.01–1.0 atm ($10^{-1}$–$10^{-3}$ MPa).

9. The method of claim 1, wherein the oxide superconductor precursor and the selected oxide superconductor differ in composition.

10. The method of claim 1, wherein the oxide superconductor precursor and the selected oxide superconductor differ crystallographically.

11. The method of claim 1, wherein the density of the oxide superconductor precursor is substantially retained during phase conversion.

12. The method of claim 1, wherein the texture of the oxide superconductor precursor is substantially retained during phase conversion.

13. The method of claim 12, wherein substantially retained includes a change of less than 5% in degree of texture between the precursor and the final article.

14. A method of claim 1, wherein substantially retained includes a change selected from the group consisting of a change in the near net shape of less than 7%, a change of less than 20% in density and a change of less than 10% in degree of texture between the precursor and the final article.

15. The method of claim 1, wherein the near net shape changes less than 6% between the precursor and the final article.

16. The method of claim 1, wherein the near net shape changes less than 3% between the precursor and the final article.

17. The method of claim 1, wherein the near net shape changes less than 1.5% between the precursor and the final article.

18. The method of claim 1, wherein substantially retained includes a change of less than 10% in density between the precursor and the final article.

19. The method of claim 1, wherein substantially retained includes a change of less than 5% in density between the precursor and the final article.

20. The method of claim 1, wherein the force applied to the precursor comprises hot isostatic pressing (HIPing).

21. The method of claim 20, wherein the HIPing force is in the range of 10 to 2500 atm (1–250 MPa).

22. The method of claim 20, wherein the HIPing force is in the range of 25 to 250 atm (2.5–25 MPa).

23. The method of claim 20, wherein the HIPing force is in the range of 25 to 100 atm (2.5–10 MPa).

24. The method of claim 1, wherein dilation of the oxide superconductor article is in the range of 1–6% in the direction transverse to the direction of elongation.

25. The method of claim 1, wherein the precursor oxide comprises BSCCO 2212, and the selected oxide superconductor comprises BSCCO 2223.

26. The method of claim 25, wherein the temperature and oxygen partial pressure are selected to fall in a range in which BSCCO 2223 is thermodynamically stable.

27. The method of claim 25, wherein BSCCO 2212 is converted into BSCCO 2223 in a two-step heat treatment in which the precursor is heated under conditions which form a liquid phase in co-existence with BSCCO 2223 and then the precursor is heated under conditions which transform the liquid phase into BSCCO 2223.

28. The method of claim 1 or 20, wherein the pressure is constant during phase conversion.

29. The method of claim 1, wherein the textured precursor possesses a degree of texture is greater than or equal to 0.7.

30. The method of claim 29, wherein the degree of texture is greater than or equal to 0.8.

31. The method of claim 29, wherein the degree of texture is greater than or equal to 0.9.

32. A method for making a BSCCO 2223 oxide superconductor article, comprising:

providing a precursor composite comprising one or more filaments of BSCCO 2212 in a metal matrix;

texturing the BSCCO 2212 precursor composite in a rolling deformation step, wherein the rolling deformation results in a 40–95% reduction in thickness of the composite;

converting the textured BSCCO oxide superconducting precursor into a BSCCO 2223 oxide superconductor, while simultaneously applying a force to the precursor which at least matches the expansion force experienced by the precursor during phase conversion to the BSCCO 2223 oxide superconductor, whereby the near net shape of the oxide superconductor precursor is substantially retained during phase conversion and whereby no further densification or texturing of the composite occurs.

* * * * *

UNITED STATES PATENT AND TRADEMARK OFFICE
CERTIFICATE OF CORRECTION

PATENT NO.    : 6,555,503 B1
DATED         : April 29, 2003
INVENTOR(S)   : Li et al.

It is certified that error appears in the above-identified patent and that said Letters Patent is hereby corrected as shown below:

<u>Title page,</u>
Item [73], Assignee, please add the following:

-- Wisconsin Alumni Research Foundation, Madison, WI (US) --.

Signed and Sealed this

Sixth Day of January, 2004

JAMES E. ROGAN
*Director of the United States Patent and Trademark Office*